United States Patent
Park et al.

(10) Patent No.: US 7,282,749 B2
(45) Date of Patent: Oct. 16, 2007

(54) ORGANIC ELECTROLUMINESCENT DEVICE AND METHOD OF FABRICATING THE SAME

(75) Inventors: Jae-Yong Park, Gyeonggi-do (KR); Choong-Keun Yoo, Icheon (KR)

(73) Assignee: LG.Philips LCD Co., Ltd., Seoul (KR)

( * ) Notice: Subject to any disclaimer, the term of this patent is extended or adjusted under 35 U.S.C. 154(b) by 119 days.

(21) Appl. No.: 11/019,228

(22) Filed: Dec. 23, 2004

(65) Prior Publication Data
US 2005/0139844 A1    Jun. 30, 2005

(30) Foreign Application Priority Data
Dec. 26, 2003 (KR) .................. 10-2003-0097877
Dec. 27, 2003 (KR) .................. 10-2003-0098132

(51) Int. Cl.
*H01L 29/22* (2006.01)
*G02F 1/1339* (2006.01)

(52) U.S. Cl. .............. 257/99; 257/688; 257/E33.058; 257/E33.059; 349/153; 349/190; 438/26; 438/28

(58) Field of Classification Search .......... 349/43, 349/149, 153, 190; 257/98, 100, 688, E33.058, 257/E33.059, 99; 438/26, 28
See application file for complete search history.

(56) References Cited

U.S. PATENT DOCUMENTS

| | | | |
|---|---|---|---|
| 6,175,345 B1 | 1/2001 | Kuribayashi et al. | |
| 6,548,961 B2 | 4/2003 | Barth et al. | |
| 2002/0044232 A1* | 4/2002 | Cho et al. | 349/43 |
| 2002/0060770 A1* | 5/2002 | Chung et al. | 349/153 |
| 2002/0125484 A1* | 9/2002 | Silvernail et al. | 257/79 |
| 2002/0158577 A1 | 10/2002 | Shimoda et al. | |
| 2003/0107699 A1* | 6/2003 | Jung et al. | 349/153 |
| 2003/0117569 A1* | 6/2003 | Kim et al. | 349/153 |
| 2003/0122476 A1* | 7/2003 | Wang et al. | 313/493 |
| 2003/0178936 A1* | 9/2003 | Park et al. | 313/505 |
| 2003/0179169 A1* | 9/2003 | Izumi | 345/87 |
| 2003/0184221 A1* | 10/2003 | Mishima | 313/512 |
| 2003/0201445 A1 | 10/2003 | Park et al. | |

(Continued)

FOREIGN PATENT DOCUMENTS

JP    2000-306664    11/2000

(Continued)

OTHER PUBLICATIONS

English Abstract of KR 2003049540 A to Kim et al.*

*Primary Examiner*—Bradley W Baumeister
*Assistant Examiner*—Matthew W. Such
(74) *Attorney, Agent, or Firm*—Morgan, Lewis & Bockius LLP (57) ABSTRACT

An organic electroluminescent device includes: first and second substrates facing each other and spaced apart from each other, the first and second substrates having a central portion and a peripheral portion; an array layer on the first substrate, the array layer including a thin film transistor; an organic electroluminescent diode on the second substrate; a connection pattern between the first and second substrates, the connection pattern electrically connecting the thin film transistor and the organic electroluminescent diode; and a seal pattern in the peripheral portion, the seal pattern including a metallic material for attaching the first and second substrates.

17 Claims, 10 Drawing Sheets

U.S. PATENT DOCUMENTS

| | | | |
|---|---|---|---|
| 2003/0211644 A1* | 11/2003 | Boroson et al. | 438/26 |
| 2004/0041976 A1* | 3/2004 | Kida et al. | 349/187 |
| 2004/0070723 A1* | 4/2004 | Imayama et al. | 349/153 |
| 2004/0201348 A1* | 10/2004 | Anandan | 313/512 |
| 2005/0023976 A1* | 2/2005 | Wang | 313/512 |

FOREIGN PATENT DOCUMENTS

| | | | |
|---|---|---|---|
| JP | 2001-177509 | | 4/2001 |
| KR | 2002-0047889 | | 6/2002 |
| KR | 2003049540 A | * | 6/2003 |
| KR | 2003-0083529 | | 10/2003 |
| KR | 2003-0084233 | | 11/2003 |
| KR | 2004-0079476 | | 9/2004 |
| WO | WO-02/078101 | | 10/2005 |

\* cited by examiner

ORGANIC ELECTROLUMINESCENT DEVICE AND METHOD OF FABRICATING THE SAME

The present invention claims the benefit of the Korean Patent Application Nos. 2003-0097877 filed in Korea on Dec. 26, 2003 and 2003-0098132 filed in Korea on Dec. 27, 2003, which are both hereby incorporated by reference.

BACKGROUND OF THE INVENTION

1. Field of the Invention

The present invention relates to a display device, and more particularly, to an organic electroluminescent device and a method of fabricating the same.

2. Discussion of the Related Art

In general, organic electroluminescent (EL) devices emit light by injecting electrons from a cathode and holes from an anode into a luminescent layer, combining the electrons and the holes to generate an exciton, and transitioning the exciton from an excited state to a ground state. Unlike liquid crystal display (LCD) devices, an additional light source is not necessary in the organic EL devices because the transition of the exciton between states causes light to be emitted from the luminescent layer. Accordingly, size and weight of the organic EL device is smaller than an LCD device. Since organic EL devices have lower power consumption, superior brightness, and fast response time, organic EL devices are being incorporated into consumer electronic products, such as cellular phones, car navigation system (CNS), personal digital assistants (PDA), camcorders, and palmtop computers. Moreover, since fabrication of organic EL devices is simple, it is much cheaper to produce organic EL devices than LCD devices.

Organic EL devices can be categorized into passive matrix organic EL devices and active matrix organic EL devices. Although the passive matrix organic EL devices have a simple structure and are formed using simple fabricating processes, the passive matrix organic EL devices require a relatively large amount of power to operate. Further, display sizes of the passive matrix organic EL devices are limited by their wiring structures. For example, as the total number of conductive lines increases, aperture ratios of the passive matrix organic EL devices decrease. In contrast, the active matrix organic EL devices have high luminescent efficiency and can produce high-quality images on large displays using relatively little power.

Figure 1:
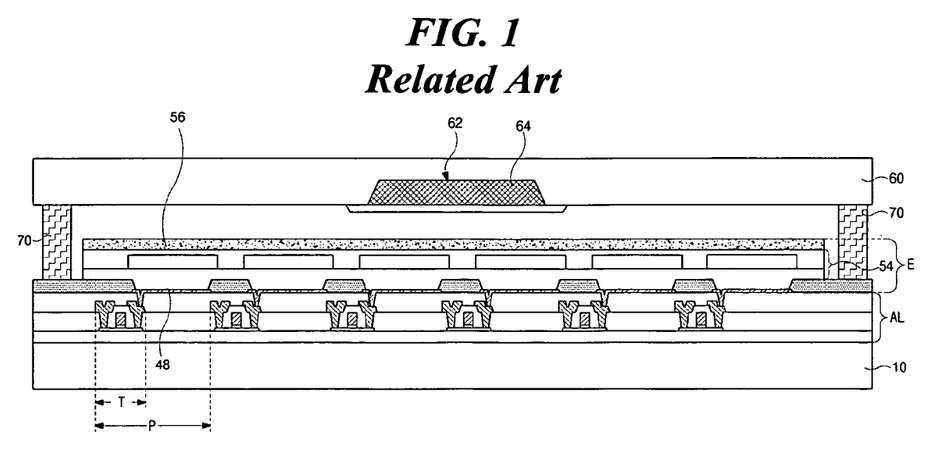
FIG. 1 is a cross-sectional view of an organic electroluminescent device according to the related art.

FIG. 1 is a cross-sectional view of an organic electroluminescent device according to the related art. As shown in FIG. 1, first and second substrates 10 and 60 face each other and are spaced apart from each other. An array layer "AL" is formed on the first substrate 10. The array layer "AL" includes a thin film transistor (TFT) "T" in each pixel region "P." An organic electroluminescent (EL) diode "E" is formed on the array layer "AL." The organic electroluminescent (EL) diode "E" includes a first electrode 48, an organic luminescent layer 54 and a second electrode 56. Light emitted from the organic luminescent layer 54 passes through one of the first and second electrodes 48 and 56 that is transparent.

Organic EL devices can be classified into a top emission type and a bottom emission type according to the emission direction of the light. For example, when the first electrode 48 is formed to be transparent so that light is emitted from a bottom of the organic EL device, the organic EL device is referred to as a bottom emission type. In a bottom emission type, the second substrate 60 is used as an encapsulation plate. Further, the second substrate 60 has a concave portion 62 and a moisture absorbent material 64 formed in the concave portion 62. The moisture absorbent material 62 eliminates any moisture and oxygen that may penetrate into the bottom emission type organic EL diode "E." The first and second substrates 10 and 60 are attached with a seal pattern 70 at their periphery.

Figure 2A:
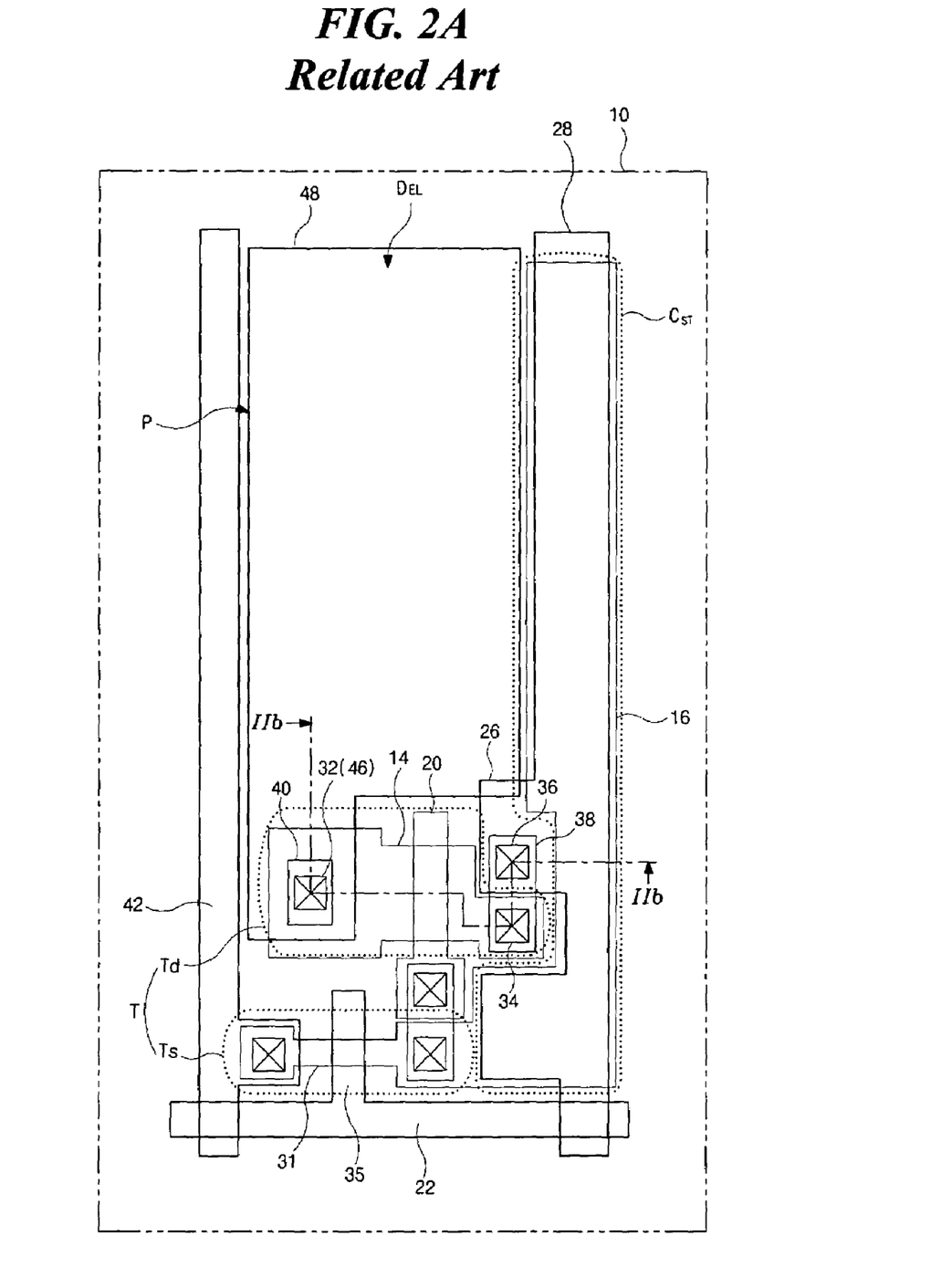
FIG. 2A is a plan view showing a pixel region of an organic electroluminescent device according to the related art.
Figure 2B:
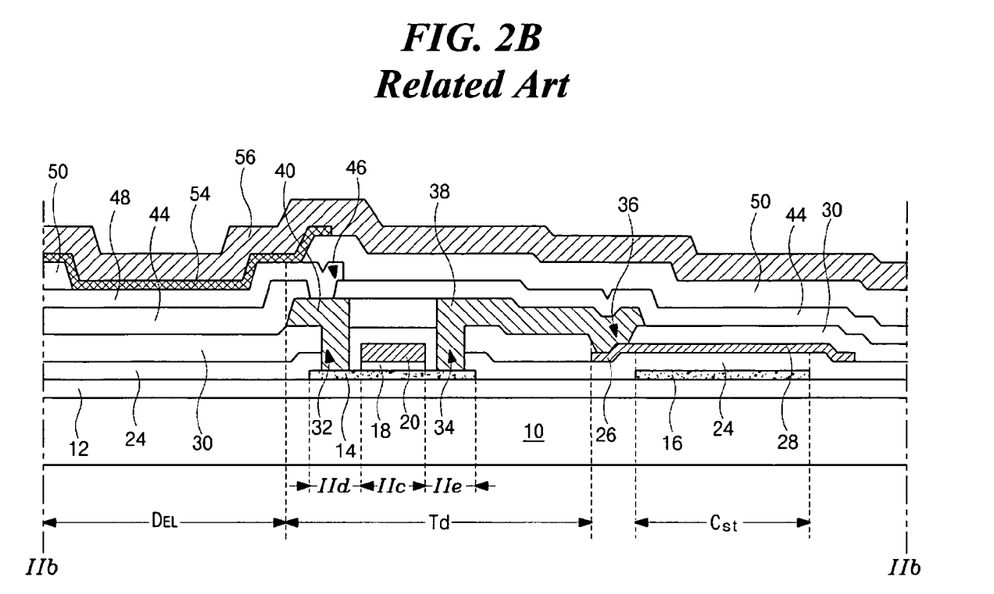
FIG. 2B is a cross-sectional view taken along line "IIb-IIb" of FIG. 2A.

FIG. 2A is a plan view showing a pixel region of an organic electroluminescent device according to the related art and FIG. 2B is a cross-sectional view taken along a line "IIb-IIb" of FIG. 2A. In FIGS. 2A and 2B, a gate line 22 crosses a data line 42 to define a pixel region "P." A buffer layer 12 is formed on a first substrate 10. A driving semiconductor layer 14 and a capacitor electrode 16 spaced apart from each other are formed on the buffer layer 12. A gate insulating layer 18 and a driving gate electrode 20 are sequentially formed on the semiconductor layer 14. The driving semiconductor layer 14 includes an active region "IIc" corresponding to the driving gate electrode 20 and source and drain regions "IIe" and "IId" at both sides of the active region "IIc." A first passivation layer 24 is formed on the driving gate electrode 20 and the capacitor electrode 16 and a power electrode 26 is formed on the first passivation layer 24 over the capacitor electrode 16. The power electrode 26 is a portion of a power line 28 crossing the gate line 22.

A second passivation layer 30 is formed on the power electrode 26. The first and second passivation layers 24 and 30 have a first contact hole 32 exposing the drain region "IId" and a second contact hole 34 exposing the source region "IIe." Further, the second passivation layer 30 has a third contact hole 36 exposing the power electrode 26. A driving source electrode 38 and a driving drain electrode 40 are formed on the second passivation layer 30. The driving source electrode 38 is connected to the source region "IIe" through the second contact hole 34 and the power electrode 26 through the third contact hole 36, while the driving drain electrode 40 is connected to the drain region "IId" through the first contact hole 32.

A third passivation layer 44 is formed on the driving source and drain electrodes 38 and 40. The third passivation layer 44 includes a drain contact hole 46 exposing the driving drain electrode 40. A first electrode 48 connected to the driving drain electrode 40 through the drain contact hole 46 is formed on the third passivation layer 44 in an emission area "EA" of the pixel region "P." An interlayer insulating layer 50 is formed on the first electrode 48. The interlayer insulating layer 50 has an opening exposing the first electrode 48. An organic luminescent layer 54 is formed on the interlayer insulating layer 50 in the emission area "EA" and a second electrode 56 is formed on the organic luminescent layer 54. The organic luminescent layer 54 contacts the first electrode 48 through the opening of the interlayer insulating layer 50.

The driving semiconductor layer 14, the driving gate electrode 20, the driving source electrode 38 and the driving drain electrode 40 constitute a driving thin film transistor (TFT) "$T_D$." The organic EL device can have a switching TFT "$T_S$" connected to the gate line 22 and the data line 42 and a driving TFT "$T_D$" connected to the switching TFT "$T_S$" and the power line 28. The driving gate electrode 20 is connected to the switching TFT "$T_S$" and the drain electrode 40 has an island shape. The first electrode 48, the second electrode 56 and the organic luminescent layer 54 between the first and second electrodes 48 and 56 constitute an organic EL diode. Moreover, the capacitor electrode 16, the power electrode 26 and the first passivation layer 24 between the capacitor electrode 16 and the power electrode 26 constitute a storage capacitor "$C_{ST}$."

In an organic EL device according to the related art, an array unit and an organic EL diode are formed on a first substrate, and a second substrate is attached to the first substrate for encapsulation. However, when the array unit and the organic EL diode are formed on one substrate in this way, production yield of the organic EL device is determined by multiplying the TFT's yield and the organic EL diode's yield. Since the organic EL diode's yield is relatively low, the production yield of the overall EL device is limited by the organic EL diode's yield. For example, even when TFTs are well fabricated, an organic EL device using a thin film of about 1000 Å thickness can be judged to be bad due to the defects in an organic EL layer. This results not only in the loss of the organic EL device but also in a loss of the TFTs that have to be discarded. Such loss wastes materials and increases production costs.

Bottom emission type organic EL devices have the advantages of high encapsulation stability and high process flexibility. However, the bottom emission type organic EL devices are ineffective as high resolution devices because they have poor aperture ratios. In contrast, top emission organic EL devices have a higher expected life span because they are more easily designed and have a higher aperture ratio. In top emission type organic EL devices, the cathode is generally formed on an organic EL layer. As a result, transmittance and optical efficiency of a top emission type organic EL devices are reduced because of a limited number of materials that may be used. If a thin film-type passivation layer is formed over the cathode to prevent a reduction of the light transmittance while protecting the cathode, the thin film-type passivation layer may fail to prevent infiltration of exterior air into the device.

SUMMARY OF THE INVENTION

Accordingly, the present invention is directed to an organic electroluminescent device and a method of fabricating the same that substantially obviate one or more of the problems due to limitations and disadvantages of the related art.

An object of the present invention is to provide an organic electroluminescent device having an array element substrate and an organic electroluminescent diode substrate, and a method of fabricating the same.

Another object of the present invention is to provide a dual panel type organic electroluminescent device having a seal pattern of a metallic material for preventing infiltration of exterior moisture and oxygen, and a method of fabricating the same.

Another object of the present invention is to provide a dual panel type organic electroluminescent device having a seal pattern having a lattice shape.

An object of the present invention is to provide an organic electroluminescent device having improved production yield.

An object of the present invention is to provide an organic electroluminescent device having a high resolution, a high aperture ratio and a high brightness, and a method of fabricating the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent device includes: first and second substrates facing each other and spaced apart from each other, the first and second substrates having a central portion and a peripheral portion; an array layer on the first substrate, the array layer including a thin film transistor; an organic electroluminescent diode on the second substrate; a connection pattern between the first and second substrates, the connection pattern electrically connecting the thin film transistor and the organic electroluminescent diode; and a seal pattern in the peripheral portion, the seal pattern including a metallic material for attaching the first and second substrates.

In another aspect, a fabricating method of an organic electroluminescent device includes: forming an array layer on a first substrate having a central portion and a peripheral portion, the array layer including a thin film transistor; forming an organic electroluminescent diode on a second substrate having a central portion and a peripheral portion; forming a connection pattern on one of the array layer and the organic electroluminescent diode; forming a seal pattern in the peripheral portion of one of the first and second substrates, the seal pattern including a metallic material; and attaching the first and second substrates such that the array layer is electrically connected to the organic electroluminescent diode through the connection pattern.

In another aspect, an organic electroluminescent device includes: first and second substrates facing and spaced apart from each other, the first and second substrates having a central portion and a peripheral portion; an array layer on the first substrate, the array layer including a thin film transistor; an organic electroluminescent diode on the second substrate; a connection pattern between the first and second substrates, the connection pattern electrically connecting the thin film transistor and the organic electroluminescent diode; and a seal pattern in the peripheral portion, the seal pattern including a plurality of seal lines surrounding the central portion and a plurality of geometrical patterns disposed between the seal lines and attaching the first and second substrates.

In another aspect, a method of fabricating an organic electroluminescent device includes: forming an array layer on a first substrate, the array layer including a thin film transistor; forming an organic electroluminescent diode on a second substrate having a central portion and a peripheral portion; forming a connection pattern on one of the array layer and the organic electroluminescent diode; forming a seal pattern in the peripheral portion of one of the first and second substrates, the seal pattern including a plurality of seal lines surrounding the central portion and a plurality of geometrical patterns disposed between the seal lines; and attaching the first and second substrates such that the array layer is electrically connected to the organic electroluminescent diode through the connection pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE EMBODIMENTS

Reference will now be made in detail to the preferred embodiments of the present invention, examples of which are illustrated in the accompanying drawings.

Figure 3:
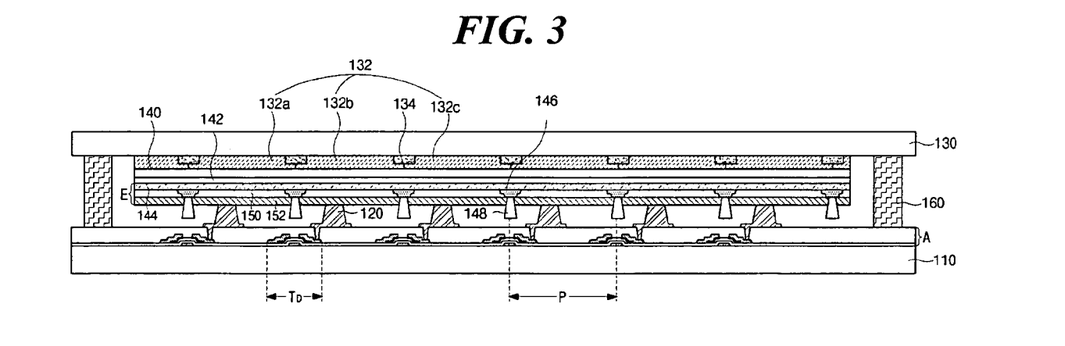
FIG. 3 is a cross-sectional view showing an organic electroluminescent device according to a first embodiment of the present invention.

FIG. 3 is a cross-sectional view showing an organic electroluminescent device according to a first embodiment of the present invention. As shown in FIG. 3, first and second substrates 110 and 130 face each other and are spaced apart from each other. An array layer "A" is formed on an inner surface of the first substrate 110. The array layer "A" includes a driving thin film transistor (TFT) "$T_D$." In contrast to the related art driving TFT "$T_D$" shown in FIG. 2B having a top gate structure using polycrystalline silicon, the driving TFT "$T_D$" shown in FIG. 3 has a bottom gate structure. Even though the driving TFT "$T_D$" shown in FIG. 3 has a bottom gate structure using amorphous silicon, the driving TFT "$T_D$" can alternatively have a top gate structure using polycrystalline silicon.

A black matrix 134 is formed on an inner surface of the second substrate 130 and a color filter layer 132 is formed on the black matrix 134. The color filter layer 132 includes red, green and blue sub-color filters 132a, 132b and 132c. The black matrix 134 surrounds each sub-color filter. A planarization layer 140 of an insulating material is formed on the color filter layer 132. For example, the planarization layer 140 may include an organic insulating material. A barrier layer 142 is formed on the planarization layer 140 to prevent gas ejection from the color filter layer 132 and a first electrode 144 is formed on the barrier layer 142. An interlayer insulating layer 146 and a separator 148 having a taper shape are sequentially formed on the first electrode 144 at a boundary portion of a pixel region "P." An organic luminescent layer 150 and a second electrode 152 are sequentially formed on the first electrode 144 in the pixel region "P." The organic luminescent layer 150 and the second electrode 152 are automatically patterned into each pixel region "P" due to the separator 148 and interlayer insulating layer 146. The first electrode 144, the organic luminescent layer 150 and the second electrode 152 constitute an organic electroluminescent (EL) diode "E."

A connection pattern 120 is formed between the driving TFT "$T_D$" and the organic EL diode "E." For example, the connection pattern 120 may be formed of multiple layers, including an organic insulating layer, to obtain sufficient height corresponding to a gap between the first and second substrates 110 and 130. Since the connection pattern 120 is electrically connected to the driving TFT "$T_D$" and the organic EL diode "E," a current of the driving TFT "$T_D$" is transmitted to the organic EL diode "E" through the connection pattern 120. When the organic EL device is a top emission type, the first electrode is transparent and light from the organic luminescent layer 150 is emitted through the first electrode 144. For example, the first electrode 144 and the second electrode 152 function as an anode and a cathode, respectively, and the first electrode 144 is a transparent conductive material, such as indium-tin-oxide (ITO) or indium-zinc-oxide (IZO).

The first and second substrates 110 and 130 are attached with a seal pattern 160 at a peripheral portion of the first and second substrates 110 and 130. When the color filter layer 132 is used for full color display in an organic EL device, the organic luminescent layer 150 can be formed to emit single colored light. Moreover, even though not shown in FIG. 3, a color-changing medium (CCM) may be formed between the color filter layer 132 and the planarization layer 140. When an organic EL device includes only the color filter layer 132, the organic luminescent layer 150 can emit white-colored light. When an organic EL device includes the color filter layer 132 and the CCM, the organic luminescent layer 150 can emit sky blue-colored light or greenish blue-colored light.

In an organic EL device according to embodiments of the present invention, since an array layer including TFTs and an organic EL diode are formed on the respective substrates, production yield and production management efficiency are improved, and lifetime of an organic EL device is lengthened. In embodiments of the invention in which the EL device is a top emission type, a thin film transistor can be easily designed as well as a high resolution and a high aperture ratio can be obtained regardless of a lower array layer.

In the related art organic EL device where an array layer, includes both TFTs and an organic EL diode, is formed on a first substrate and attached to a second substrate while in a pressurized nitrogen ($N_2$) ambient atmosphere. Accordingly, an interior pressure of the organic EL device is higher than an exterior pressure such that infiltration of exterior moisture and oxygen is prevented. In an organic EL device according to embodiments of the present invention, however, an array layer and an organic EL diode are formed on a first substrate and a second substrate, respectively, and the first and second substrates are attached under a vacuum condition to improve contact property between the elements and the substrate. Accordingly, an interior pressure of the organic EL device is lower than an exterior pressure. Thus, the possibility of infiltration of exterior moisture and oxygen may be increased. More particularly, the exterior moisture and/or oxygen may penetrate through a seal pattern at an interface between the seal pattern and the substrate.

Figure 4:
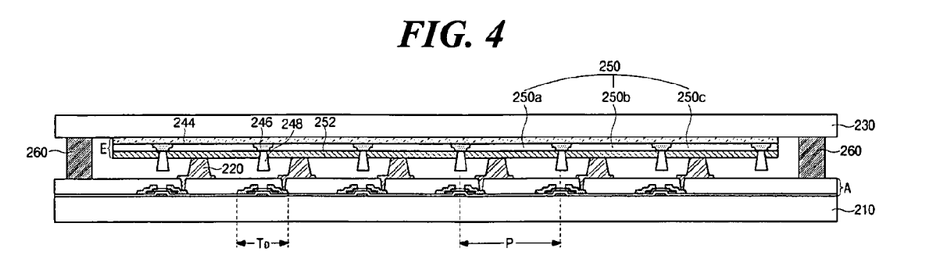
FIG. 4 is a cross-sectional view showing an organic electroluminescent device according to a second embodiment of the present invention.

FIG. 4 is a cross-sectional view showing an organic electroluminescent device according to a second embodiment of the present invention. As shown in FIG. 4, first and second substrates 210 and 230 face each other and are spaced apart from each other. An array layer "A," including a driving thin film transistor (TFT) "$T_D$" having a bottom gate structure, is formed on an inner surface of the first substrate 110. Even though the driving TFT "$T_D$" shown in FIG. 4 has a bottom gate structure using amorphous silicon, the driving TFT "$T_D$" can alternatively have a top gate structure using polycrystalline silicon.

A first electrode 244 is formed on an inner surface of the second substrate 230. An interlayer insulating layer 246 and a separator 248 having a taper shape are sequentially formed on the first electrode 244 at a boundary portion of a pixel region "P." An organic luminescent layer 250 including red, green and blue sub-luminescent layers 250a, 250b and 250c and a second electrode 252 are sequentially formed on the first electrode 244 in the pixel region "P." Each sub-luminescent layer 250a, 250b and 250c and the second electrode 252 are automatically patterned in each pixel region "P" due to the separator 248 and the interlayer insulating layer 246. The first electrode 244, the organic luminescent layer 250 and the second electrode 252 constitute an organic electroluminescent (EL) diode "E."

A connection pattern 220 is formed between the driving TFT "$T_D$" and the organic EL diode "E." For example, the connection pattern 220 may be formed of multiple layers, including an organic insulating layer to obtain sufficient height corresponding to a gap between the first and second substrates 210 and 230. Since the connection pattern 220 is electrically connected to the driving TFT "$T_D$" and the organic EL diode "E," a current of the driving TFT "$T_D$" is transmitted to the organic EL diode "E" through the connection pattern 220. When the organic EL device is a top emission type, the first electrode is transparent and light from the organic luminescent layer 250 is emitted through the first electrode 244. For example, the first electrode 244 and the second electrode 252 function as an anode and a cathode, respectively, and the first electrode 244 is a transparent conductive material, such as indium-tin-oxide (ITO) or indium-zinc-oxide (IZO).

The first and second substrates 210 and 230 are attached with a seal pattern 260 at a peripheral portion of the first and second substrates 210 and 230. The seal pattern 260 includes a metallic material having a melting point lower than about 100° C. For example, the seal pattern 260 can include a single metallic material, such as indium (In), tin (Sn) or bismuth (Bi), or an alloy metallic material, such as indium-tin (In—Sn) alloy, tin-bismuth (Sn—Bi) alloy or indium-tin-bismuth (In—Sn—Bi) alloy. Since adhesion of such metallic materials to a substrate is more than twice as much as adhesion of an epoxy material to a substrate, infiltration of exterior moisture and oxygen is prevented. Specifically, when a metallic material having a relatively low melting point is used for the seal pattern 260, deterioration of elements in the organic EL device is prevented during the processing step of forming the seal pattern 260. In the alternative, the seal pattern 260 can be formed of a non-solvent metallic material. Since a solvent metallic material has a strong volatility, particles outgassed from the solvent metallic material are apt to deteriorate elements in an organic EL device.

Figure 5:
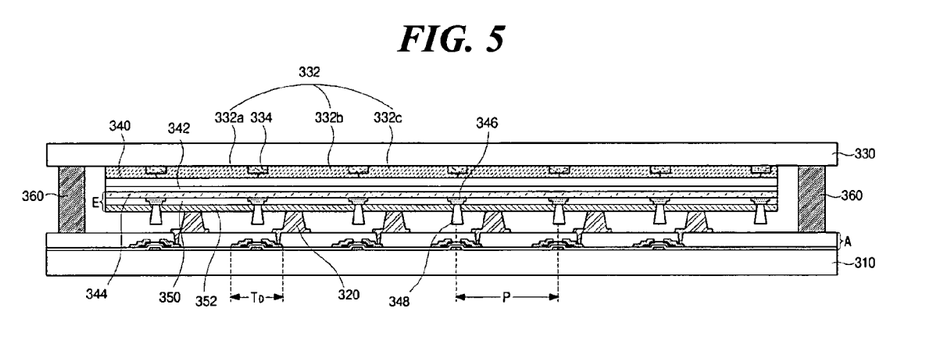
FIG. 5 is a cross-sectional view showing an organic electroluminescent device according to a third embodiment of the present invention.

FIG. 5 is a cross-sectional view showing an organic electroluminescent device according to a third embodiment of the present invention. As shown in FIG. 5, first and second substrates 310 and 330 face each other and are spaced apart from each other. An array layer "A," including a driving thin film transistor (TFT) "TD," is formed on an inner surface of the first substrate 310. Even though the driving TFT "$T_D$" shown in FIG. 5 has a bottom gate structure using amorphous silicon, the driving TFT "$T_D$" can alternatively have a top gate structure using polycrystalline silicon.

A black matrix 334 is formed on an inner surface of the second substrate 330 and a color filter layer 332 is formed on the black matrix 334. The color filter layer 332 includes red, green and blue sub-color filters 332a, 332b and 332c and the black matrix 334 surrounds each sub-color filter. A planarization layer 340 of an insulating material is formed on the color filter layer 332. For example, the planarization layer 340 is an organic insulating material. A barrier layer 342 is formed on the planarization layer 340 to prevent gas ejection from the color filter layer 332 and a first electrode 344 is formed on the barrier layer 342. An interlayer insulating layer 346 and a separator 348 having a taper shape are sequentially formed on the first electrode 344 at a boundary portion of a pixel region "P." An organic luminescent layer 350 and a second electrode 352 are sequentially formed on the first electrode 344 in the pixel region "P." The organic luminescent layer 350 and the second electrode 352 are automatically patterned in each pixel region "P" due to the separator 348 and interlayer insulating layer 346. The first electrode 344, the organic luminescent layer 350 and the second electrode 352 constitute an organic electroluminescent (EL) diode "E."

A connection pattern 320 is formed between the driving TFT "$T_D$" and the organic EL diode "E." For example, the connection pattern 320 may be formed of multiple layers, including an organic insulating layer, to obtain sufficient height corresponding to a gap between the first and second substrates 310 and 330. Since the connection pattern 320 is electrically connected to the driving TFT "$T_D$" and the organic EL diode "E," a current of the driving TFT "$T_D$" is transmitted to the organic EL diode "E" through the connection pattern 320. When the organic EL device is a top emission type, the first electrode is transparent and light from the organic luminescent layer 350 is emitted through the first electrode 344. For example, the first electrode 344 and the second electrode 352 function as an anode and a cathode, respectively, and the first electrode 344 is a transparent conductive material, such as indium-tin-oxide (ITO) or indium-zinc-oxide (IZO).

The first and second substrates 310 and 330 are attached with a seal pattern 360 at a peripheral portion of the first and second substrates 310 and 330. The seal pattern 360 includes a metallic material having a melting point lower than about 100° C. For example, the seal pattern 360 can be a single metallic material such as indium (In), tin (Sn) or bismuth (Bi), or an alloy metallic material, such as indium-tin (In—Sn) alloy, tin-bismuth (Sn—Bi) alloy or indium-tin-bismuth (In—Sn—Bi) alloy. In the alternative, the seal pattern 360 can be formed of a non-solvent metallic material.

Figure 6A:
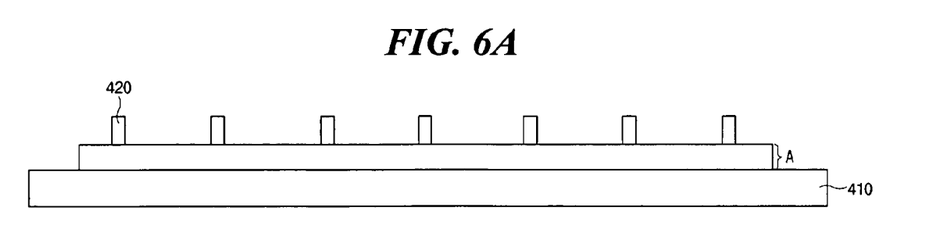
FIGS. 6A to 6D are cross-sectional views showing a process of fabricating an organic electroluminescent device according to an exemplary embodiment of the present invention.

FIGS. 6A to 6D are cross-sectional views showing a process of fabricating an organic electroluminescent device according to exemplary embodiments of the present invention. As shown in FIG. 6A, an array layer "A" is formed on a first substrate 410 and a connection pattern 420 is formed on the array layer "A." Although not shown in FIG. 6A, the array layer "A" can include a gate line, a data line, a power line, a switching thin film transistor (TFT) connected to the gate line and the data line, and a driving TFT connected to the switching TFT and the power line. In the alternative, the connection pattern 420 can be formed on a second substrate 430 (of FIG. 6C).

Figure 6B:
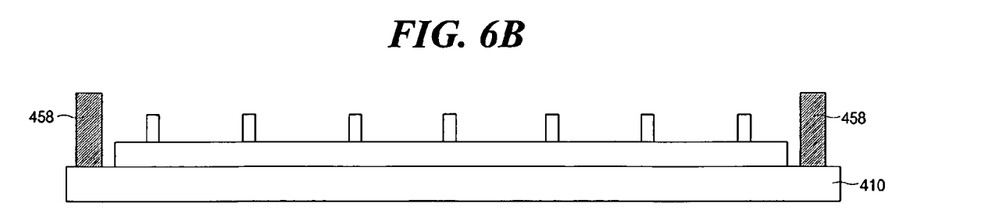

As shown in FIG. 6B, a metal line 458 of a low melting point metallic material is formed at a peripheral portion of the first substrate 410. After the metal line 458 is formed to have the shape of a seal pattern by using, for example, a thin wire of low melting point metallic material, the metal line 458 is disposed at the peripheral portion of the first substrate 410 using an apparatus without any additional patterning step. When a non-solvent metallic material is used, the metal line 456 may be formed through a coating method. In the alternative, the metal line 456 can be formed on a second substrate 430 (of FIG. 6C).

Figure 6C:
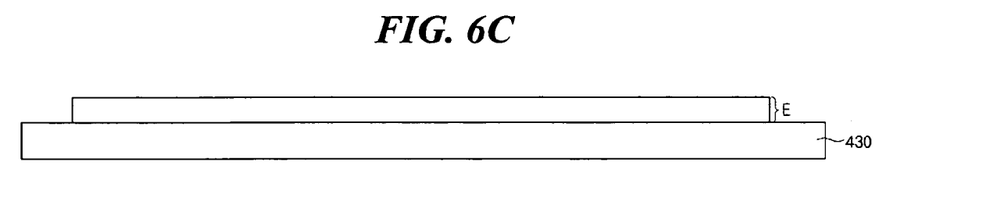

As shown in FIG. 6C, an organic electroluminescent (EL) diode "E" is formed on a second substrate 430. Even though not shown in FIG. 6C, the organic EL diode "E" may include a first electrode, an organic luminescent layer and a second electrode, and an interlayer insulating layer and a separator may be sequentially formed on the first electrode at a boundary portion of each pixel region. For full color display, an organic luminescent layer including red, green and blue sub-luminescent layers may be used without a color filter layer, or an organic luminescent layer emitting a single colored light may be used with a color filter layer (and color-changing medium).

Figure 6D:
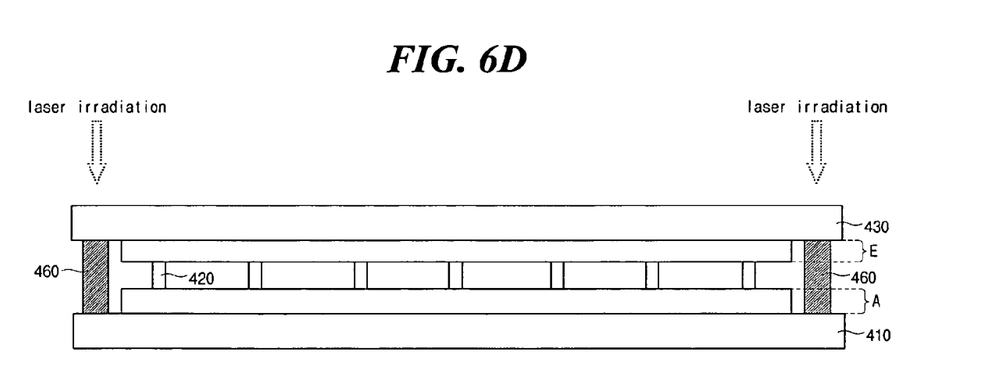

As shown in FIG. 6D, after the first and second substrates 410 and 430 are attached such that the array layer "A" faces the organic EL diode "E," a laser beam can be irradiated onto the metal line 458 (of FIG. 6B) through one of the first and second substrates 410 and 430 to form a seal pattern 460 through melting and solidification steps. When the first and second substrates 410 and 430 are attached, the array layer "A" and the organic EL diode "E" are connected to each other through the connection pattern 420. Since the adhesion of the metallic material of the seal pattern is more than twice as much as the adhesion of an epoxy material, infiltration of exterior moisture and oxygen is prevented so that deterioration of elements in an organic EL device is prevented. When a non-solvent metallic material is used for the metal line 458 (of FIG. 6B), the seal pattern 460 may be obtained through a curing step instead of a laser irradiation step.

Figure 7:
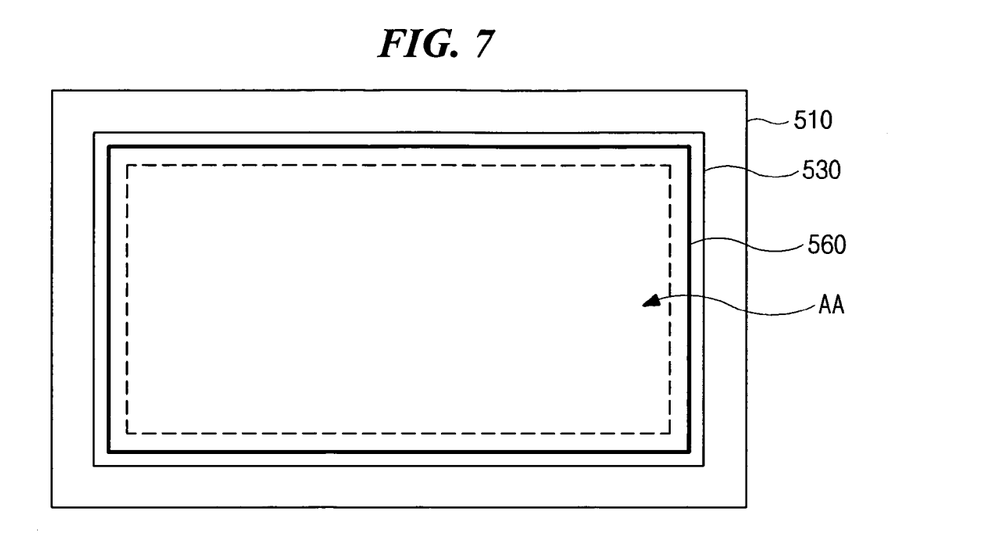
FIG. 7 is a plan view showing an organic electroluminescent device according to an exemplary embodiment of the present invention.

FIG. 7 is a plan view showing an organic electroluminescent device according to an exemplary embodiment of the present invention. As shown in FIG. 7, first and second substrates 510 and 530 face each other and a seal pattern 560 of a metallic material is formed at a peripheral portion of the first and second substrates 510 and 530. The metallic material may have a melting point lower than about 100° C. For example, the seal pattern 560 may include a single metallic material, such as indium (In), tin (Sn) or bismuth (Bi), or an alloy metallic material, such as indium-tin (In—Sn) alloy, tin-bismuth (Sn—Bi) alloy or indium-tin-bismuth (In—Sn—Bi) alloy. In the alternative, a non-solvent metallic material may be used for the seal pattern 560.

An active area "AA" emitting light for display is defined inside of the seal pattern 560. The first substrate 510 has an area larger than an area of the second substrate 530 for pads that connect the first substrate 510 to an external circuit. Accordingly, a plurality of link lines in the active area "AA" may extend across the seal pattern 530. Since the seal pattern 530 is formed of a metallic material, an insulating layer having a relatively low dielectric constant is formed between the plurality of link lines and the seal pattern 530 to reduce electric interference therebetween. For example, the insulating layer between the plurality of link lines and the seal pattern 530 may include an organic insulating material, such as benzocyclobutene (BCB) or acrylic resin. Although not shown in FIG. 7, an array layer including thin film transistors (TFTs) is formed on the first substrate 510 and an organic electroluminescent diode is formed on the second substrate 530. The array layer is connected to the organic EL diode through a connection pattern.

The seal pattern 560, made of a metallic material, is in the peripheral portion of the first and second substrates 510 and 530 to prevent infiltration of exterior moisture and oxygen. Since the metallic material has excellent adhesion and film quality, infiltration of exterior moisture and oxygen is prevented. Accordingly, reliability, lifetime and endurance of an organic EL device are improved and the organic EL device is stabilized.

Figure 8:
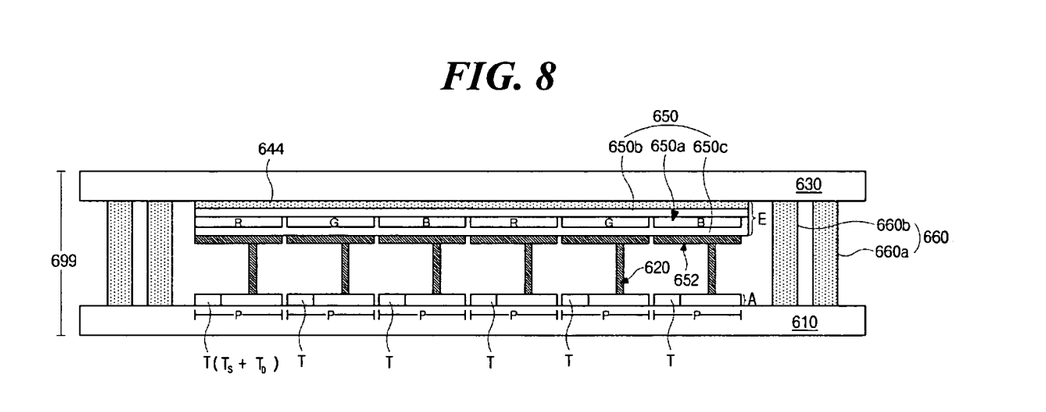
FIG. 8 is a cross-sectional view showing an organic electroluminescent device according to a fourth embodiment of the present invention.

The infiltration of exterior moisture and oxygen can also be prevented by doubling up the seal pattern. FIG. 8 is a cross-sectional view showing an organic electroluminescent device according to a fourth embodiment of the present invention. As shown in FIG. 8, an organic electroluminescent (EL) device 699 includes a first substrate 610 and a second substrate 630 facing each other and spaced apart from each other. The first and second substrates 610 and 630 have a plurality of pixel regions "P." An array layer "A," including thin film transistors (TFTs) "T," is formed on an inner surface of the first substrate 610. An organic EL diode "E" is formed on an inner surface of the second substrate 630. The TFTs may include a switching TFT "$T_S$" and a driving TFT "$T_D$" in each pixel region "P." The organic EL diode "E" includes a first electrode 644 on the second substrate 630, an organic luminescent layer 650 on the first electrode 644 and a second electrode 652 on the organic luminescent layer 650. The first electrode 644 can be formed on an entire surface of the second substrate 630, while the organic luminescent layer 650 and the second electrode 652 may be formed in each pixel region "P." The organic luminescent layers 650 emit red, green and blue colored lights and are alternately disposed in each pixel region "P." Alternatively, the organic luminescent layer 650 may be formed of multiple layers. For example, when the first and second electrodes 644 and 652 function as an anode and a cathode, respectively, the organic luminescent layer 650 can have a hole injection layer (HIL) 650b on the first electrode 644, an emitting material layer (EML) 650a on the HIL 650b and an electron injection layer (EIL) 650c on the EML 650a. Alternatively, a hole transporting layer (HTL) and an electron transporting layer (ETL) can also be formed between the injection layers 650b and 650c and the EML 650a.

The first and second substrates 610 and 630 are attached with a seal pattern 660, and the array layer "A" is connected to the organic EL diode "E" through a connection pattern 620. For example, the connection pattern 620 may be formed of multiple layers including an organic insulating layer to obtain sufficient height corresponding to a gap between the first and second substrates 610 and 630. The seal pattern 660 includes first and second seal lines 660a and 660b spaced apart from each other. Although not shown in FIG. 8, a geometrical pattern may be formed between the first and second seal lines 660a and 660b. For example, a lattice pattern may be formed between the first and second seal lines 660a and 660b. Alternatively, more than two spaced apart seal lines can be used to constitute a seal pattern. Since the seal pattern 660 includes the first and second seal lines 660a and 660b and a geometrical pattern, infiltration of exterior moisture and oxygen is prevented.

Figure 9:
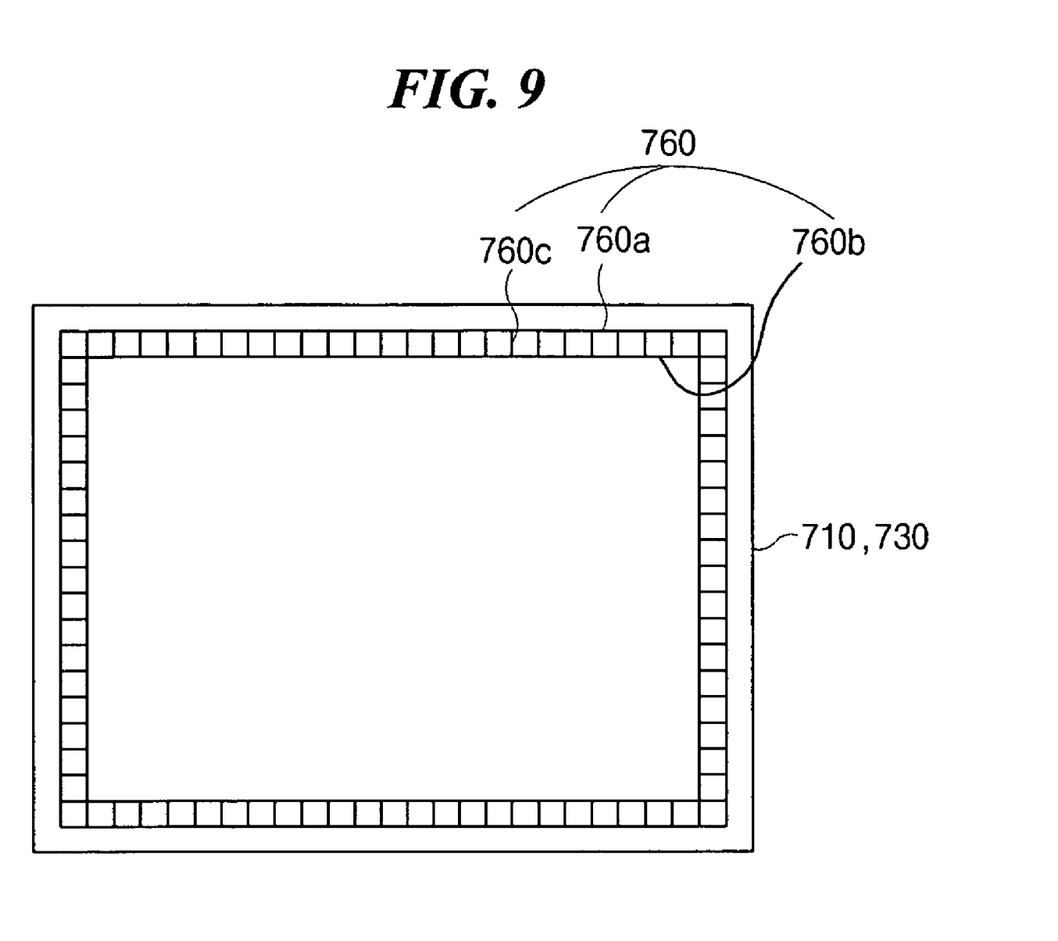
FIG. 9 is a plan view showing an organic electroluminescent device according to a fifth embodiment of the present invention.

FIG. 9 is a plan view showing an organic electroluminescent device according to a fifth embodiment of the present invention. As shown in FIG. 9, a seal pattern 760 is formed in a peripheral portion of first and second substrates 710 and 730. The seal pattern 760 includes first, second and third seal lines 760a, 760b and 760c. The first and second seal lines 760a and 760b are spaced apart from each other. The second seal line 760b surrounds a central portion of the first and second substrates 710 and 730 and the first seal line 760a surrounds the second seal line 760a. The third seal line 760c is disposed between the first and second seal lines 760a and 760b. The third seal line 760c includes a plurality of bar patterns perpendicular to and equidistantly spaced between the first and second seal lines 760a and 760b. Equidistant spacing between bar patterns is not required.

Figure 10:
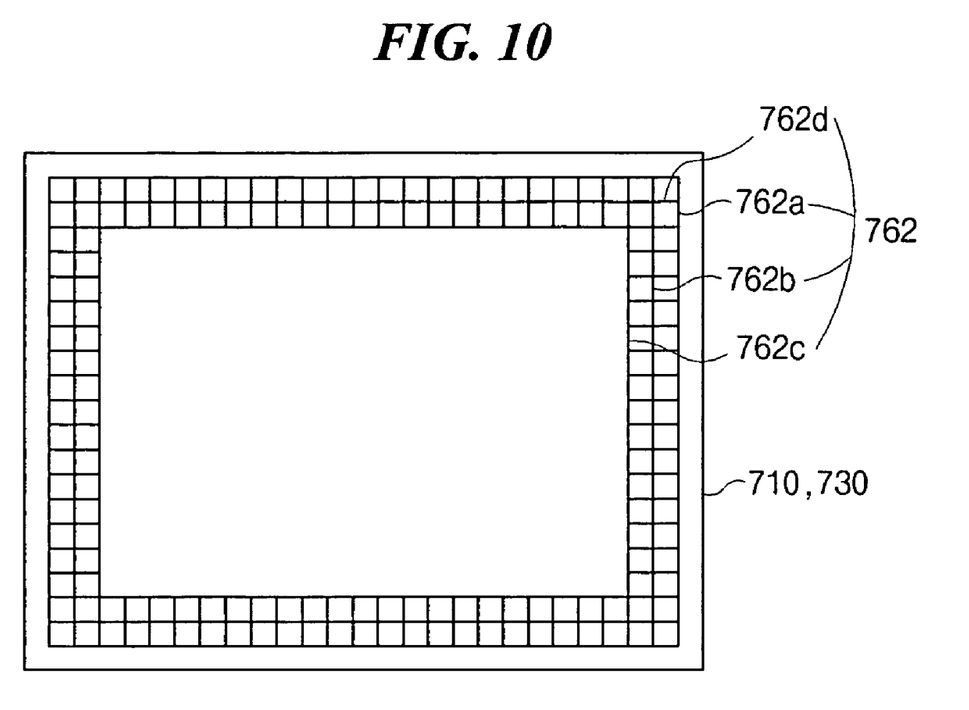
FIG. 10 is a plan view showing an organic electroluminescent device according to a sixth embodiment of the present invention.

FIG. 10 is a plan view showing an organic electroluminescent device according to a sixth embodiment of the present invention. As shown in FIG. 10, a seal pattern 762 is formed in a peripheral portion of first and second substrates 710 and 730. The seal pattern 762 includes first, second, third and fourth seal lines 762a, 762b, 762c and 762d. The first, second and third seal lines 762a, 762b and 762c are spaced apart from each other. The third seal line 762c surrounds a central portion of the first and second substrates 710 and 730. In addition, the second seal line 762b surrounds the third seal line 762c and the first seal line 762a surrounds the second seal line 762b. The fourth seal line 762d is disposed between the first and third seal lines 762a and 762c through the second seal line 762b. The fourth seal line 762d includes a plurality of bar patterns perpendicular to and equidistantly spaced between the first, second and third seal lines 762a, 762b and 762c. Moreover, equidistance spacing between bar patterns is not required.

Figure 11:
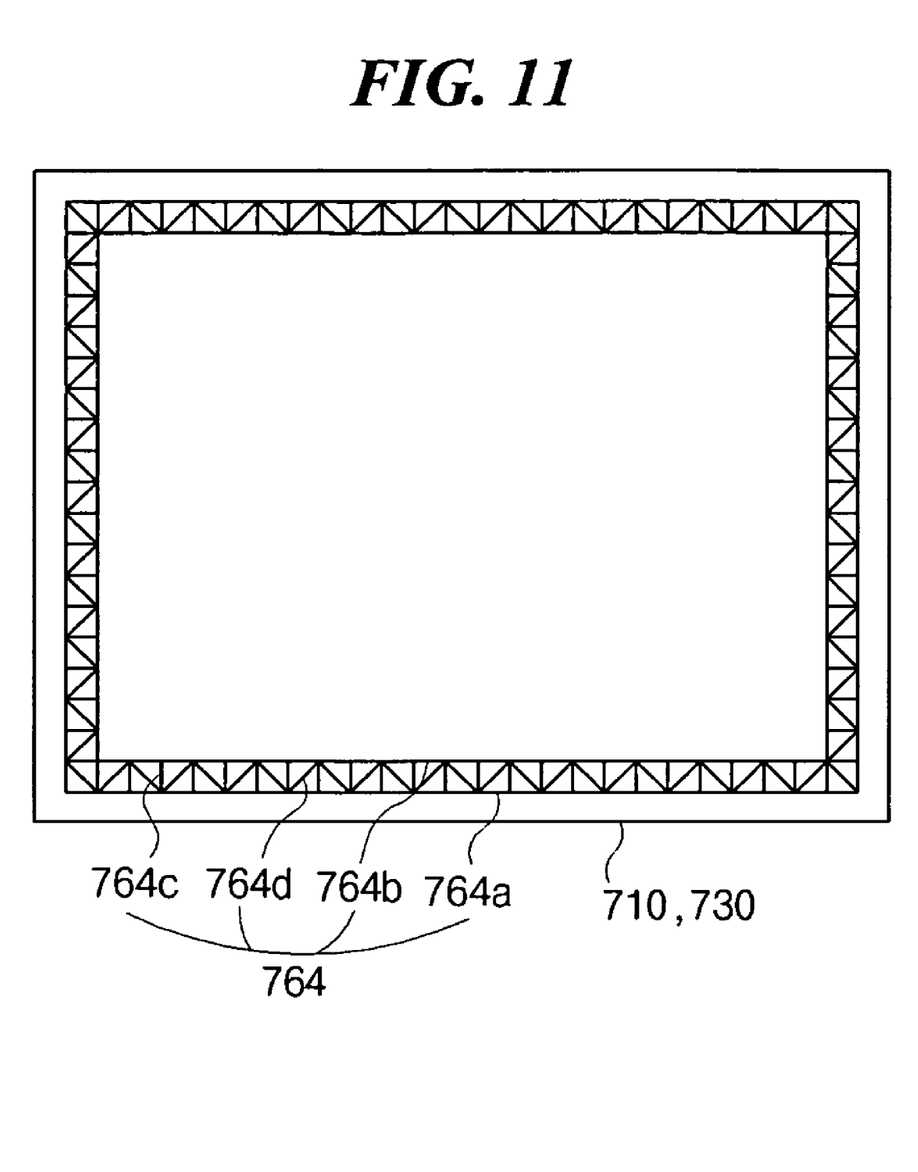
FIG. 11 is a plan view showing an organic electroluminescent device according to a seventh embodiment of the present invention.

FIG. 11 is a plan view showing an organic electroluminescent device according to a seventh embodiment of the present invention. As shown in FIG. 11, a seal pattern 764 is formed in a peripheral portion of first and second substrates 710 and 730. The seal pattern 764 includes first, second, third and fourth seal lines 764a, 764b, 764c and 764d. The first and second seal lines 764a and 764b are spaced apart from each other. The second seal line 764c surrounds a central portion of the first and second substrates 710 and 730 and the first seal line 764a surrounds the second seal line 764b. The third and fourth seal lines 764c and 764d are disposed between the first and third seal lines 764a and 764b. The third seal line 764c includes a plurality of first bar patterns perpendicular to the first and second seal lines 764a and 764b and the fourth seal line 764d includes a plurality of second bar patterns oblique to the first and second seal lines 764a and 764b. Moreover, a direction of the second bar patterns may be changed in another embodiment.

Figure 12:
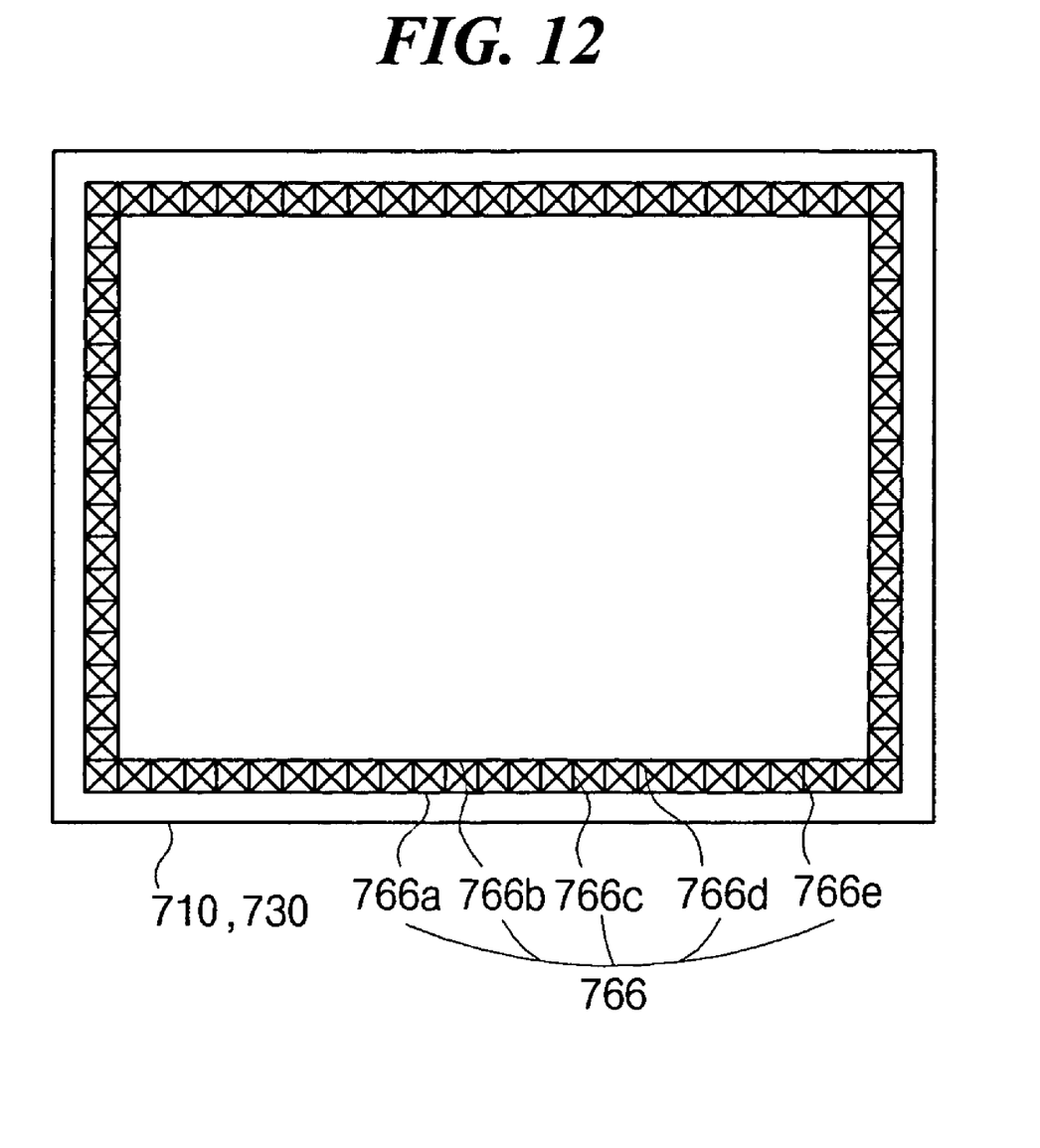
FIG. 12 is a plan view showing an organic electroluminescent device according to an eighth embodiment of the present invention.

FIG. 12 is a plan view showing an organic electroluminescent device according to an eighth embodiment of the present invention. As shown in FIG. 12, a seal pattern 766 is formed in a peripheral portion of first and second substrates 710 and 730. The seal pattern 766 includes first, second, third, fourth and fifth seal lines 766a, 766b, 766c, 766d and 766e. The first and second seal lines 766a and 766b are spaced apart from each other. The second seal line 766c surrounds a central portion of the first and second substrates 710 and 730 and the first seal line 766a surrounds the second seal line 766b. The third, fourth and fifth seal lines 766c, 766d and 766e are disposed between the first and third seal lines 766a and 766b. The third seal line 766c includes a plurality of first bar patterns perpendicular to the first and second seal lines 766a and 766b. The fourth seal line 766d includes a plurality of second bar patterns oblique to the first and second seal lines 766a and 766b and the fifth seal line 766e includes a plurality of third bar patterns oblique to the first and second seal lines 766a and 766b. The second bar pattern crosses the third bar pattern.

As shown in FIGS. 9 to 12, since a seal pattern of an organic EL device includes two or three seal lines surrounding a central portion of first and second substrates and a plurality of geometrical patterns are disposed between the two or three seal lines, external moisture and oxygen are blocked by the seal pattern and a deterioration of organic luminescent layer is prevented. In addition, the seal pattern may be formed of a metallic material having excellent adhesion and film quality. Accordingly, the blocking capability of the seal pattern is further improved.

In an organic electroluminescent device according to the present invention, since array elements and an organic EL diode are formed on a respective substrate, production yield and production management efficiency are improved, and lifetime of an organic EL device is increased. In addition, since the ELD can be a top emission type, the thin film transistor can be easily designed, and high resolution and high aperture ratio can be obtained regardless of lower array patterns. Moreover, since a seal pattern is formed of a metallic material having excellent adhesion and film quality, infiltration of exterior moisture and oxygen is prevented. Accordingly, a lifetime, a reliability and a stability of an organic EL device are improved. Finally, since a seal pattern includes two or three seal lines surrounding a central portion of first and second substrates and a plurality of geometrical patterns are disposed between the two or three seal lines, external moisture and oxygen are blocked by the seal pattern and a deterioration of organic luminescent layer is prevented. Accordingly, lifetime, reliability and a stability of an organic EL device are improved.

It will be apparent to those skilled in the art that various modifications and variations can be made in the organic electroluminescent device and fabricating method thereof of the present invention without departing from the spirit or scope of the invention. Thus, it is intended that the present invention cover the modifications and variations of this invention provided they come within the scope of the appended claims and their equivalents.

What is claimed is:

1. An organic electroluminescent device, comprising:
first and second substrates facing each other and spaced apart from each other, the first and second substrates having a central portion and a peripheral portion;
an array layer on the first substrate, the array layer including a thin film transistor;
an organic electroluminescent diode on the second substrate;
a connection pattern between the first and second substrates, the connection pattern electrically connecting the thin film transistor and the organic electroluminescent diode; and
a seal pattern in the peripheral portion attaching the first substrate and the second substrate, the seal pattern including at least a first seal line surrounding the central portion and a second seal line surrounded by the first seal line, and a plurality of third seal lines disposed between and intersecting the first and second seal lines, the plurality of third seal lines defining geometrical patterns between the first and second seal lines, wherein the first and second seal lines are spaced apart from each other, wherein the plurality of third seal lines include seal lines equidistantly spaced apart from each other, the first seal line surrounding the second seal line and the second seal line surrounding the plurality of third seal lines.

2. The device according to claim 1, wherein the organic electroluminescent diode includes:
a first electrode on the second substrate;
an organic luminescent layer on the first electrode; and
a second electrode on the organic luminescent layer.

3. The device according to claim 2, wherein the first electrode and the second electrode are an anode and a cathode, respectively.

4. The device according to claim 3, further comprising:
a hole injection layer on the first electrode;
an emitting material layer on the hole injection layer; and
an electron injection layer on the emitting material layer.

5. The device according to claim 1, wherein the array layer includes:
a gate line on the first substrate;
a data line crossing the gate line;
a switching thin film transistor connected to the gate line and the data line; and
a driving thin film transistor connected to the switching thin film transistor.

6. The device according to claim 1, wherein the seal pattern includes a metallic material.

7. The device according to claim 6, wherein the metallic material has a melting point lower than about 100° C.

8. The device according to claim 6, wherein the metallic material is non-solvent type.

9. The device according to claim 6, wherein the metallic material includes one of indium (In), tin (Sn) and bismuth (Bi).

10. The device according to claim 6, wherein the metallic material includes one of indium-tin (In—Sn) alloy, tin-bismuth (Sn—Bi) alloy and indium-tin-bismuth (In—Sn—Bi) alloy.

11. An organic electroluminescent device, comprising:
first and second substrates facing each other and spaced apart from each other, the first and second substrates having a central portion and a peripheral portion;
an array layer on the first substrate, the array layer including a thin film transistor;
an organic electroluminescent diode on the second substrate;
a connection pattern between the first and second substrates, the connection pattern electrically connecting the thin film transistor and the organic electroluminescent diode; and
a seal pattern in the peripheral portion attaching the first substrate and the second substrate, the seal pattern including at least a first seal line surrounding the central portion and a second seal line surrounded by the first seal line, and a plurality of third seal lines disposed between and intersecting the first and second seal lines, the plurality of third seal lines defining geometrical patterns between the first and second seal lines, wherein the first and second seal lines are spaced apart from each other,
wherein the plurality of third seal lines defining geometrical patterns have a plurality of first bar patterns perpendicular to the first and second seal lines, a plurality of fourth seal lines defining geometrical patterns have a plurality of second bar patterns oblique to the first and second seal lines and a plurality of fifth seal lines defining geometrical patterns have a plurality of third bar patterns crossing the plurality of second bar patterns.

12. A method of fabricating an organic electroluminescent device, comprising:
forming an array layer on a first substrate, the array layer including a thin film transistor;
forming an organic electroluminescent diode on a second substrate having a central portion and a peripheral portion;
forming a connection pattern on one of the array layer and the organic electroluminescent diode;
forming a seal pattern in the peripheral portion of one of the first and second substrates, the seal pattern including at least a first seal line surrounding the central portion and a second seal line surrounded by the first seal line, wherein the first and second seal lines are formed to be spaced apart, and a plurality of third seal lines disposed between and intersecting the first and second seal lines, the plurality of third seal lines defining geometrical patterns between the first and second seal lines; and
attaching the first and second substrates such that the array layer is electrically connected to the organic electroluminescent diode through the connection patterns wherein forming the plurality of third seal lines includes seal lines eciuidistantly spaced apart from each other, the first seal line surrounding the second seal line and the second seal line surrounding the plurality of third seal lines.

13. The method according to claim 12, wherein forming the organic electroluminescent diode includes:
forming a first electrode on the second substrate;
forming an organic luminescent layer on the first electrode; and
forming a second electrode on the organic luminescent layer.

14. The method according to claim 12, wherein the first electrode and the second electrode are an anode and a cathode, respectively.

15. The method according to claim 14, further comprising:
forming a hole injection layer on the first electrode;
forming an emitting material layer on the hole injection layer; and
forming an electron injection layer on the emitting material layer.

16. The method according to claim 12, wherein forming the array layer includes:
forming a gate line on the first substrate;
forming a data line crossing the gate line;
forming a switching thin film transistor connected to the gate line and the data line; and
forming a driving thin film transistor connected to the switching thin film transistor.

17. A method of fabricating an organic electroluminescent device, comprising:
forming an array layer on a first substrate, the array layer including a thin film transistor;
forming an organic electroluminescent diode on a second substrate having a central portion and a peripheral portion;
forming a connection pattern on one of the array layer and the organic electroluminescent diode;

forming a seal pattern in the peripheral portion of one of the first and second substrates, the seal pattern including at least a first seal line surrounding the central portion and a second seal line surrounded by the first seal line, wherein the first and second seal lines are formed to be spaced apart, and a plurality of third seal lines disposed between and intersecting the first and second seal lines, the plurality of third seal lines defining geometrical patterns between the first and second seal lines; and attaching the first and second substrates such that the array layer is electrically connected to the organic electroluminescent diode through the connection pattern, wherein forming the plurality of third seal lines defining geometrical patterns includes: forming a plurality of first bar patterns perpendicular to the first and second seal lines; forming a plurality of fourth seal lines defining geometrical patterns having a plurality of second bar patterns oblique to the first and second seal lines; and forming a plurality of fifth seal lines defining geometrical patterns having a plurality of third bar patterns crossing the plurality of second bar patterns.

* * * * *